(12) United States Patent
Kuo

(10) Patent No.: US 10,783,960 B2
(45) Date of Patent: Sep. 22, 2020

(54) NON-VOLATILE MEMORY CELL AND NON-VOLATILE CELL ARRAY

(71) Applicant: eMemory Technology Inc., Hsin-Chu (TW)

(72) Inventor: Ping-Yu Kuo, Hsinchu County (TW)

(73) Assignee: EMEMORY TECHNOLOGY INC., Hsin-Chu (TW)

( * ) Notice: Subject to any disclaimer, the term of this patent is extended or adjusted under 35 U.S.C. 154(b) by 0 days.

(21) Appl. No.: 16/592,951

(22) Filed: Oct. 4, 2019

(65) Prior Publication Data

US 2020/0160909 A1 May 21, 2020

Related U.S. Application Data

(60) Provisional application No. 62/768,099, filed on Nov. 16, 2018.

(51) Int. Cl.
| | |
|---|---|
| *G11C 11/56* | (2006.01) |
| *H01L 27/02* | (2006.01) |
| *G11C 5/14* | (2006.01) |
| *G11C 16/30* | (2006.01) |
| *G11C 16/24* | (2006.01) |
| *G11C 16/28* | (2006.01) |

(Continued)

(52) U.S. Cl.
CPC .......... *G11C 11/5642* (2013.01); *G05F 3/22* (2013.01); *G05F 3/30* (2013.01); *G11C 5/147* (2013.01); *G11C 16/0408* (2013.01); *G11C 16/0433* (2013.01); *G11C 16/08* (2013.01); *G11C 16/10* (2013.01); *G11C 16/14* (2013.01); *G11C 16/24* (2013.01); *G11C 16/26* (2013.01); *G11C 16/28* (2013.01); *G11C 16/30* (2013.01); *G11C 16/3445* (2013.01); *G11C 16/3459* (2013.01); *H01L 27/0207* (2013.01); *H01L 27/11524* (2013.01)

(58) Field of Classification Search
CPC . G11C 11/5642; G11C 16/0408; G11C 16/10; G11C 16/26; G11C 16/3459; G11C 16/14; G11C 16/3445; G11C 16/0433; G11C 5/147; G11C 16/30; G11C 16/24; G11C 16/28; G11C 16/08; G11C 7/06; G05F 3/30; G05F 3/22; H01L 27/0207; H01L 27/11524
See application file for complete search history.

(56) References Cited

U.S. PATENT DOCUMENTS

| | | |
|---|---|---|
| 6,920,067 B2 | 7/2005 | Hsu et al. |
| 7,209,392 B2 | 4/2007 | Chen et al. |

(Continued)

*Primary Examiner* — Jerome Leboeuf
(74) *Attorney, Agent, or Firm* — WPAT, PC

(57) ABSTRACT

A non-volatile memory cell includes a first select transistor, a first floating gate transistor, a second select transistor and a second floating gate transistor. The first select transistor is connected with a source line and a first program word line. The first floating gate transistor has a first floating gate. The first floating gate transistor is connected with the first select transistor and a first program bit line. The second select transistor is connected with the source line and a first read word line. The second floating gate transistor has a second floating gate. The second floating gate transistor is connected with the second select transistor and a first read bit line. The first floating gate and the second floating gate are connected with each other.

15 Claims, 7 Drawing Sheets

(51) Int. Cl.
*G11C 16/08* (2006.01)
*G11C 16/04* (2006.01)
*G11C 16/10* (2006.01)
*G11C 16/26* (2006.01)
*G11C 16/34* (2006.01)
*G05F 3/30* (2006.01)
*G05F 3/22* (2006.01)
*G11C 16/14* (2006.01)
*H01L 27/11524* (2017.01)

(56) References Cited

U.S. PATENT DOCUMENTS

| | | |
|---|---|---|
| 7,609,539 B2 | 10/2009 | Peng et al. |
| 9,502,426 B1 | 11/2016 | Kuo et al. |
| 2006/0033143 A1* | 2/2006 | Chen ............... H01L 29/7883 |
| | | 257/315 |
| 2009/0003074 A1* | 1/2009 | Georgescu .......... H01L 29/7883 |
| | | 365/185.18 |
| 2015/0214316 A1* | 7/2015 | Guo ................. H01L 29/42328 |
| | | 257/300 |

* cited by examiner

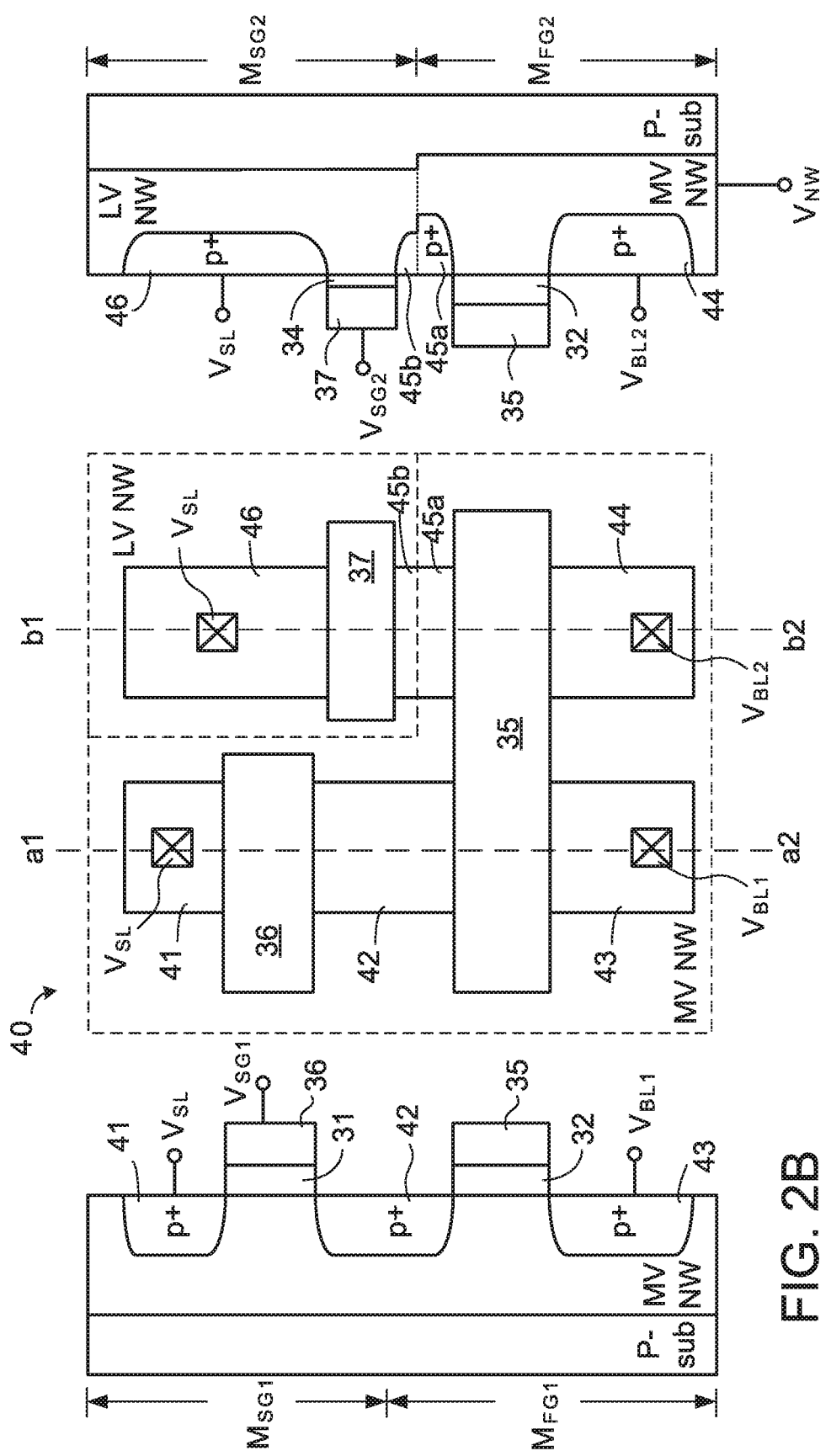

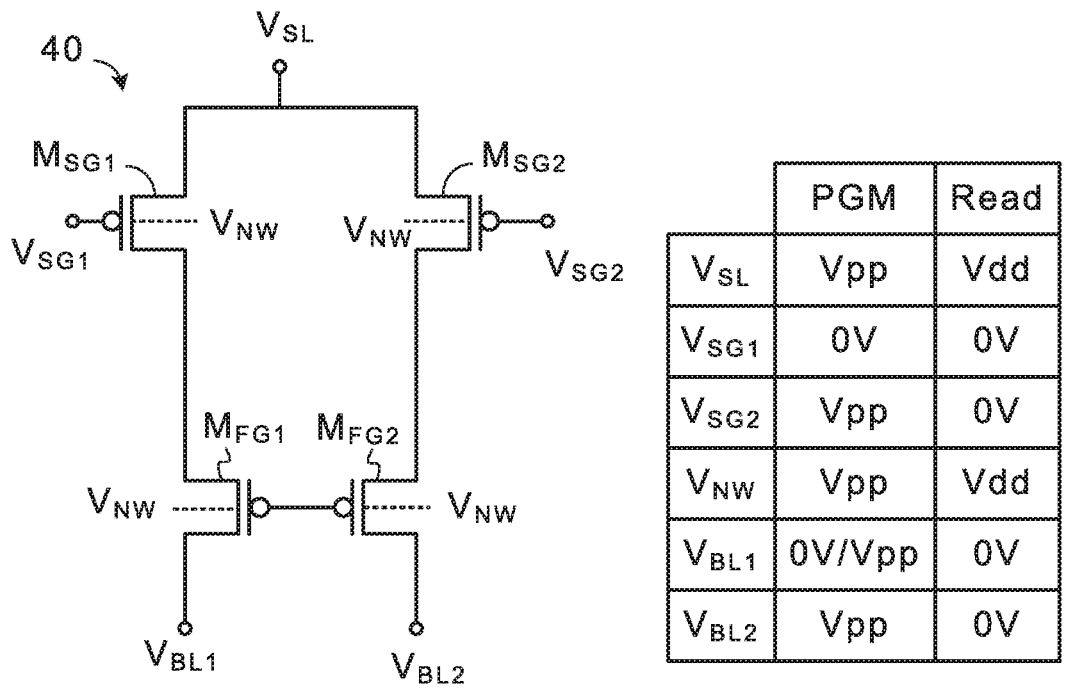
FIG. 2D
FIG. 3A
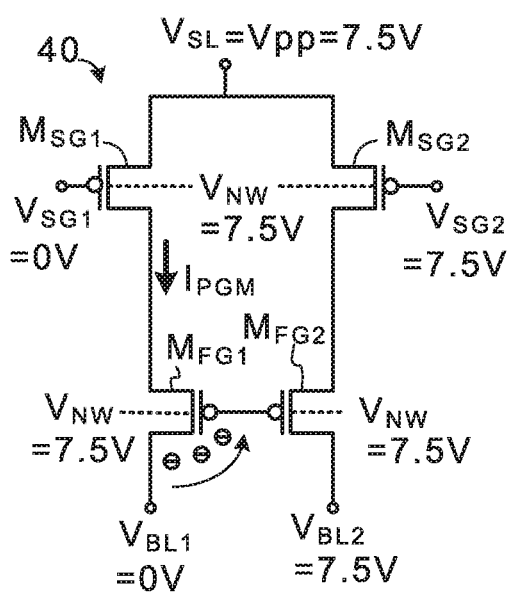
FIG. 3B
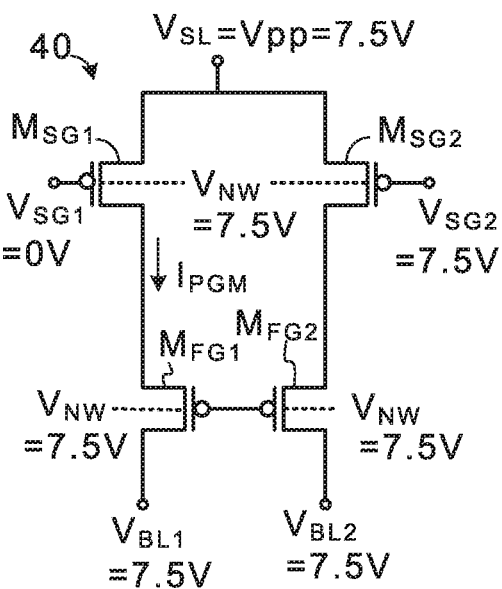
FIG. 3C

NON-VOLATILE MEMORY CELL AND NON-VOLATILE CELL ARRAY

This application claims the benefit of U.S. provisional application Ser. No. 62/768,099, filed Nov. 16, 2018, the subject matter of which is incorporated herein by reference.

FIELD OF THE INVENTION

The present invention relates to a memory cell and a memory cell array, and more particularly to a non-volatile memory cell and a non-volatile memory array.

BACKGROUND OF THE INVENTION

An integrated circuit embedded with a single-poly non-volatile memory is disclosed in U.S. Pat. No. 6,920,067. The non-volatile memory has a non-volatile memory cell. FIG. 1A is a schematic top view illustrating a conventional non-volatile memory cell. FIG. 1B is a schematic cross-sectional view illustrating the conventional non-volatile memory cell as shown in FIG. 1A. FIG. 1C is a schematic equivalent circuit diagram of the conventional non-volatile memory cell as shown in FIG. 1A.

Please refer to FIGS. 1A, 1B and 1C. The conventional non-volatile memory cell 20 comprises two serially-connected p-type transistors. The two p-type transistors are constructed in an N-well region (NW). The N-well region NW is connected to an N-well voltage $V_{NW}$. The first p-type transistor is used as a floating gate transistor. The second p-type transistor is used as a select transistor.

In the first p-type transistor, a gate oxide layer 27 is formed over the N-well region NW, and a floating gate 26 is formed over the gate oxide layer 27. A p-type source/drain region 21 receives a bit line voltage $V_{BL}$. Moreover, a p-type source/drain region 22 may be considered as a combination of a p-type source region of the first p-type transistor and a p-type drain region of the second p-type transistor.

In the second p-type transistor, a gate oxide layer 25 is formed over the N-well region NW, and a select gate 24 is formed over the gate oxide layer 25. The select gate 24 receives a select gate voltage $V_{SG}$. Moreover, a p-type source/drain region 23 receives a source line voltage $V_{SL}$.

Generally, the p-type source/drain region 21 is connected with a bit line for receiving the bit line voltage $V_{BL}$, the select gate 24 of the second p-type transistor is connected with a word line for receiving the select gate voltage $V_{SG}$, and the p-type source/drain region 23 is connected with a source line for receiving a source line voltage $V_{SL}$. By properly controlling the select gate voltage $V_{SG}$, the source line voltage $V_{SL}$, the bit line voltage $V_{BL}$ and the N-well voltage $V_{NW}$, the conventional non-volatile memory cell may be operated in a program cycle or a read cycle.

The floating gate transistor with double gate structures in the conventional non-volatile memory cell 20 is a modification of the floating gate transistor with a single gate structure. That is, the floating gate transistor in the early stage has the floating gate and the control gate. Whereas, the conventional non-volatile memory cell 20 has a single floating gate but does not have the control gate. Since the two p-type transistors of the conventional non-volatile memory cell 20 have respective gates 24 and 26, the process of fabricating the conventional non-volatile memory cell 20 is compatible with the standard CMOS manufacturing process.

Nowadays, the CMOS manufacturing process is selected according to the operating voltage range of the semiconductor device. For example, the CMOS manufacturing process for a medium voltage device (also referred as a MV device) is used to fabricate a transistor that withstands higher voltage stress, and this transistor is suitable for the medium voltage operation. In addition, the CMOS manufacturing process for a low voltage device (also referred as a LV device) is used to fabricate a transistor that has fast computing speed and withstands lower voltage stress, and this transistor is suitable for the low voltage operation. For example, in the medium voltage operation, the voltage stress that can be withstood by the region between the gate terminal and the source terminal of the transistor is within the range between 3.0V and 10V. Moreover, in the low voltage operation, the voltage stress that can be withstood by the region between the gate terminal and the source terminal of the transistor is within the range between 0.8V and 2.0V. During the program cycle, the non-volatile memory cell 20 needs to receive a higher program voltage (e.g., 7V~12V). Consequently, the MV device manufacturing process is used to fabricate the first p-type transistor and the second p-type transistor of the non-volatile memory cell 20. Since the first p-type transistor and the second p-type transistor withstand the higher voltage stress during the program cycle of the non-volatile memory cell 20, the first p-type transistor and the second p-type transistor are not damaged.

The first p-type transistor and the second p-type transistor fabricated by the MV device manufacturing process need a higher operating voltage (e.g., 5V).

The transistors fabricated by the LV device manufacturing process need a very low operating voltage (e.g., 0.8V). If the non-volatile memory cell 20 is operated under the low operating voltage and the select gate voltage $V_{SG}$ is 0.8V, the first p-type transistor and the second p-type transistor cannot be normally operated. Under this circumstance, the non-volatile memory cell 20 cannot be programmed and read successfully.

SUMMARY OF THE INVENTION

An embodiment of the present invention provides a non-volatile memory cell. The non-volatile memory cell includes a first non-volatile memory cell. The first non-volatile memory cell includes a first select transistor, a first floating gate transistor, a second select transistor and a second floating gate transistor. A first source/drain terminal of the first select transistor is connected with a source line. A first select gate of the first select transistor is connected with a first program word line. The first floating gate transistor has a first floating gate. A first source/drain terminal of the first floating gate transistor is connected with a second source/drain terminal of the first select transistor. A second source/drain terminal of the first floating gate transistor is connected with a first program bit line. A first source/drain terminal of the second select transistor is connected with the source line. A second select gate of the second select transistor is connected with a first read word line. The second floating gate transistor has a second floating gate. A first source/drain terminal of the second floating gate transistor is connected with a second source/drain terminal of the second select transistor. A second source/drain terminal of the second floating gate transistor is connected with a first read bit line. The first floating gate and the second floating gate are connected with each other.

Another embodiment of the present invention provides a non-volatile memory cell. The non-volatile memory cell includes a p-type substrate, a first gate oxide layer, a second gate oxide layer, a third gate oxide layer, a first p-type source/drain region, a second p-type source/drain region, a third p-type source/drain region, a fourth p-type source/drain region, a fifth p-type source/drain region, a sixth p-type source/drain region, a first select gate, a second select gate and a floating gate. An N-well region is disposed under a first surface of the p-type substrate. The first p-type source/drain region is connected with a source line. The first p-type source/drain region and the second p-type source/drain region are disposed under the first surface of the p-type substrate, and respectively located at two opposed sides of the first gate oxide layer. The third p-type source/drain region is connected with a first bit line. The second p-type source/drain region and the third p-type source/drain region are disposed under the first surface of the p-type substrate, and respectively located at two opposed sides of the second gate oxide layer. The fourth p-type source/drain region is connected with the source line. The fourth p-type source/drain region and the fifth p-type source/drain region are disposed under the first surface of the p-type substrate, and respectively located at two opposed sides of the third gate oxide layer. The sixth p-type source/drain region is connected with a second bit line. The fifth p-type source/drain region and the sixth p-type source/drain region are disposed under the first surface of the p-type substrate, and respectively located at two opposed sides of the second gate oxide layer. The first p-type source/drain region, the second p-type source/drain region, the third p-type source/drain region, the fourth p-type source/drain region, the fifth p-type source/drain region and the sixth p-type source/drain region are not in contact with each other. The first select gate is disposed over the first gate oxide layer, and connected with a first word line. The second select gate is disposed over the third gate oxide layer, and connected with a second word line. The floating gate is disposed over the second gate oxide layer. The first gate oxide layer is thicker than the third gate oxide layer. The second gate oxide layer is thicker than the third gate oxide layer.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which:

FIG. 2A is a schematic top view illustrating a non-volatile memory cell according to an embodiment of the present invention;

FIG. 2B is a schematic cross-sectional view illustrating the non-volatile memory cell as shown in FIG. 2A and taken along a line a1-a2;

FIG. 2C is a schematic cross-sectional view illustrating the non-volatile memory cell as shown in FIG. 2A and taken along a line b1-b2;

FIG. 2D is a schematic equivalent circuit diagram of the non-volatile memory cell according to the embodiment of the present invention;

FIGS. 3A to 3E schematically illustrate associated voltage signals for programming and reading the non-volatile memory cell according to the embodiment of the present invention;

DETAILED DESCRIPTION OF PREFERRED EMBODIMENTS

Figure 1A:
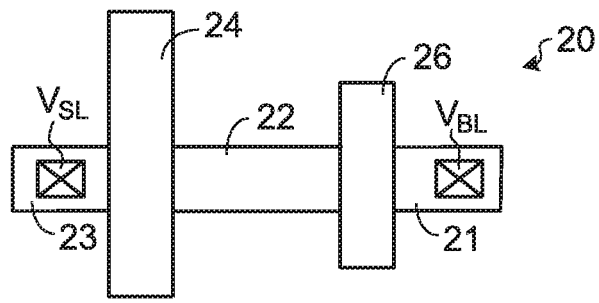
FIG. 1A (prior art) is a schematic top view illustrating a conventional non-volatile memory cell.
Figure 1B:
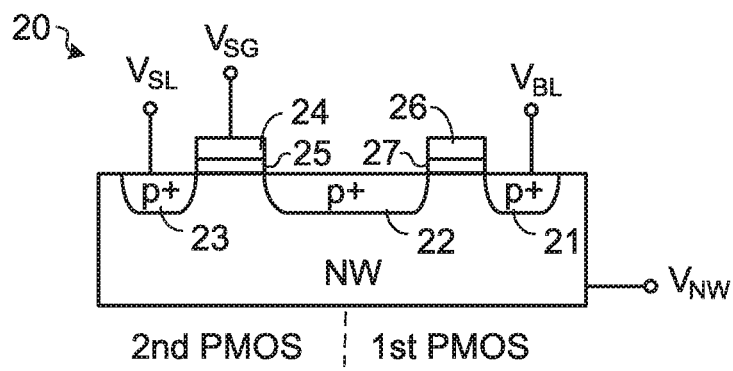
FIG. 1B (prior art) is a schematic cross-sectional view illustrating the conventional non-volatile memory cell as shown in FIG. 1A.
Figure 1C:
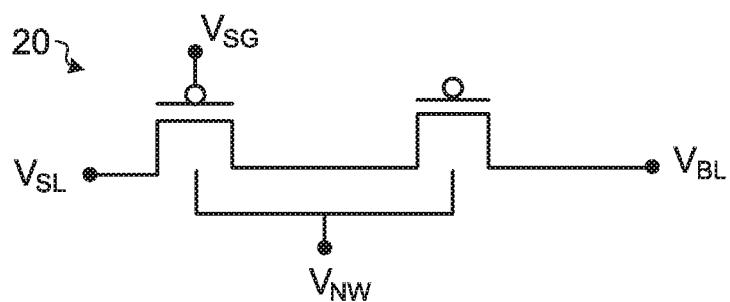
FIG. 1C (prior art) is a schematic equivalent circuit diagram of the conventional non-volatile memory cell as shown in FIG. 1A.

Please refer to FIGS. 2A, 2B, 2C and 2D. FIG. 2A is a schematic top view illustrating a non-volatile memory cell according to an embodiment of the present invention. FIG. 2B is a schematic cross-sectional view illustrating the non-volatile memory cell as shown in FIG. 2A and taken along a line a1-a2. FIG. 2C is a schematic cross-sectional view illustrating the non-volatile memory cell as shown in FIG. 2A and taken along a line b1-b2. FIG. 2D is a schematic equivalent circuit diagram of the non-volatile memory cell according to the embodiment of the present invention.

A MV device manufacturing process of a non-volatile memory cell 40 will be described as follows. Firstly, a medium voltage N-well region (MV NW) is formed in a surface of a p-type substrate (P-sub). Then, a first gate oxide layer 31, a second gate oxide layer 32, a floating gate 35 and a first select gate 36 are formed over the medium voltage N-well region (MV NW). The floating gate 35 and the first select gate 36 are made of polysilicon.

Then, plural p-type source/drain regions 41, 42, 43, 44 and 45a are formed in the medium voltage N-well region (MV NW) and located at bilateral sides of the gate oxide layers 31 and 32. These p-type source/drain regions 41, 42, 43, 44 and 45a are not in contact with each other. The p-type source/drain region 43 is connected with a first bit line to receive a first bit line voltage $V_{BL1}$. The p-type source/drain region 44 is connected with a second bit line to receive a second bit line voltage $V_{BL2}$. The p-type source/drain region 41 is connected with a source line to receive a source line voltage $V_{SL}$. The first select gate 36 is connected with a first word line to receive a first select gate voltage $V_{SG1}$.

After the MV device manufacturing process is completed, a first select transistor $M_{SG1}$, a first floating gate transistor $M_{FG1}$ and a second floating gate transistor $M_{FG2}$ are formed. The first select transistor $M_{SG1}$, the first floating gate transistor $M_{FG1}$ and the second floating gate transistor $M_{FG2}$ are p-type transistors.

A LV device manufacturing process of the non-volatile memory cell 40 will be described as follows. Firstly, a low voltage N-well region (LV NW) is formed in the surface of the p-type substrate (P-substrate). The low voltage N-well region (LV NW) is in contact with the medium voltage N-well region (MV NW). Then, a third gate oxide layer 34 and a second select gate 37 are formed over the low voltage N-well region (LV NW). The second select gate 37 is made of polysilicon.

Then, plural p-type source/drain regions 45b and 46 are formed in the low voltage N-well region (LV NW) and located at bilateral sides of the third gate oxide layer 34. The p-type source/drain regions 45a and 45b are in contact with each other. The p-type source/drain region 46 is connected with the source line to receive a source line voltage $V_{SL}$. The second select gate 37 is connected with a second word line to receive a second select gate voltage $V_{SG2}$. After the LV device manufacturing process is completed, a second select transistor $M_{SG2}$ is fabricated. In this embodiment, the second select transistor $M_{SG2}$ is a p-type transistor.

As shown in FIG. 2C, the medium voltage N-well region (MV NW) and the low voltage N-well region (LV NW) are in contact with each other. Consequently, the medium voltage N-well region (MV NW) and the low voltage N-well region (LV NW) may be considered as an N-well region that receives an N-well voltage $V_{NW}$. Moreover, the two p-type source/drain regions 45a and 45b are in contact with each other. Consequently, the p-type source/drain regions 45a and 45b may be considered as a combined p-type source/drain region.

In this embodiment, the first floating gate transistor $M_{FG1}$ and the second floating gate transistor $M_{FG2}$ are formed of the same polysilicon gate. That is, the floating gate 35 of the first floating gate transistor $M_{FG1}$ and the floating gate 35 of the second floating gate transistor $M_{FG2}$ are connected with each other. The gate oxide layers 31 and 32 of the first select transistor $M_{SG1}$, the first floating gate transistor $M_{FG1}$ and the second floating gate transistor $M_{FG2}$ have the same thickness. The first gate oxide layer 31 of the first floating gate transistor $M_{FG1}$ is thicker than the third gate oxide layer 34 of the second floating gate transistor $M_{FG2}$. Moreover, the low voltage N-well region (LV NW) is shallower than the medium voltage N-well region (MV NW). Moreover, the p-type source/drain region 45b is shallower than the p-type source/drain region 45a.

In another embodiment, the first gate oxide layer 31 of the first floating gate transistor $M_{FG1}$ is also thicker than the third gate oxide layer 34 of the second floating gate transistor $M_{FG2}$. However, the low voltage N-well region (LV NW) and the medium voltage N-well region (MV NW) have the same depth, and the p-type source/drain region 45b and the p-type source/drain region 45a have the same depth.

As shown in FIG. 2D, the non-volatile memory cell 40 comprises four transistors. The first select transistor $M_{SG1}$ and the first floating gate transistor $M_{FG1}$ are serially connected with each other. The second select transistor $M_{SG2}$ and the second floating gate transistor $M_{FG2}$ are serially connected with each other.

The first select transistor $M_{SG1}$ and the first floating gate transistor $M_{FG1}$ are serially connected with each other to define a program path of the non-volatile memory cell 40. The second select transistor $M_{SG2}$ and the second floating gate transistor $M_{FG2}$ are serially connected with each other to define a read path. The first floating gate transistor $M_{FG1}$ and the second floating gate transistor $M_{FG2}$ have the shared floating gate. That is, the floating gate of the first floating gate transistor $M_{FG1}$ and the floating gate of the second floating gate transistor $M_{FG2}$ are connected with each other.

The first source/drain terminal of the first select transistor $M_{SG1}$ receives the source line voltage $V_{SL}$. The first select gate of the first select transistor $M_{SG1}$ receives the first select gate voltage $V_{SG1}$. The second source/drain terminal of the first select transistor $M_{SG1}$ is connected with the first source/drain terminal of the first floating gate transistor $M_{FG1}$. The second source/drain terminal of the first floating gate transistor $M_{FG1}$ receives the first bit line voltage $V_{BL1}$. The first source/drain terminal of the second select transistor $M_{SG2}$ receives the source line voltage $V_{SL}$. The second select gate of the second select transistor $M_{SG2}$ receives the second select gate voltage $V_{SG2}$. The second source/drain terminal of the second select transistor $M_{SG2}$ is connected with the first source/drain terminal of the second floating gate transistor $M_{FG2}$. The second source/drain terminal of the second floating gate transistor $M_{FG2}$ receives the second bit line voltage $V_{BL2}$.

The first select transistor $M_{SG1}$, the first floating gate transistor $M_{FG1}$ and the second floating gate transistor $M_{FG2}$ are constructed in the medium voltage N-well region (MV NW), and the second select transistor $M_{SG2}$ is constructed in the low voltage N-well region (LV NW). Since the third gate oxide layer 34 of the second floating gate transistor $M_{FG2}$ is thinner, the threshold voltages of the second floating gate transistor $M_{FG2}$ is lower. Consequently, the second select gate voltage $V_{SG2}$ is suitable for the low voltage operation.

The operations of the non-volatile memory cell 40 will be described as follows. FIGS. 3A to 3E schematically illustrate associated voltage signals for programming and reading the non-volatile memory cell according to the embodiment of the present invention.

Please refer to FIG. 3A. During the program cycle, the source line voltage $V_{SL}$ is equal to Vpp, the first select gate voltage $V_{SG1}$ is 0V, the second select gate voltage $V_{SG2}$ is equal to Vpp, the N-well voltage $V_{NW}$ is equal to Vpp, and the second bit line voltage $V_{BL2}$ is equal to Vpp. The first bit line voltage $V_{BL1}$ is equal to 0V or Vpp. The voltage Vpp is a first voltage, and the 0V is the ground voltage. The first voltage Vpp is within the range between 5.0V and 10V. For example, the first voltage Vpp is 7.5V.

Please refer to FIG. 3B. During the program cycle, the first select transistor $M_{SG1}$ is turned on. That is, the program path is turned on. Since the first bit line voltage $V_{BL1}$ is equal to 0V, the magnitude of the program current $I_{PGM}$ generated by the program path is higher. The program current $I_{PGM}$ flows through the first floating gate transistor $M_{FG1}$. Consequently, hot carriers (e.g., electrons) are injected from the channel region of the first floating gate transistor $M_{FG1}$ into the floating gate of the first floating gate transistor $M_{FG1}$. Under this circumstance, the non-volatile memory cell 40 is programmed to be in a first storage state.

Moreover, during the program cycle, the second select gate voltage $V_{SG2}$ in the read path is turned off. That is, the read path is turned off. The second select gate voltage $V_{SG2}$ is the LV device. The first source/drain terminal of the second select gate voltage $V_{SG2}$ receives 7.5V. The second select gate of the second select transistor $M_{SG2}$ receives 7.5V. The body terminal of the second select transistor $M_{SG2}$ receives 7.5V. Since the second select transistor $M_{SG2}$ is not suffered from the voltage stress, the second select transistor $M_{SG2}$ is not damaged.

Please refer to FIG. 3C. During the program cycle, the first select transistor $M_{SG1}$ is turned on. That is, the program path is turned on. Since the first bit line voltage $V_{BL1}$ is equal to 7.5V, the magnitude of the program current $I_{PGM}$ generated by the program path is lower. The program current $I_{PGM}$ flowing through the first floating gate transistor $M_{FG1}$ is very low (i.e., nearly zero). Consequently, hot carriers (e.g., electrons) are not injected from the channel region of the first floating gate transistor $M_{FG1}$ into the floating gate of the first floating gate transistor $M_{FG1}$. Under this circumstance, the non-volatile memory cell 40 is programmed to be in a second storage state.

Similarly, during the program cycle, the read path is turned off. Since the second select transistor $M_{SG2}$ is not suffered from the voltage stress, the second select transistor $M_{SG2}$ is not damaged.

As mentioned above, the non-volatile memory cell 40 can be selectively programmed to be in the first storage state or the second storage state. In case that the program path of the non-volatile memory cell 40 is turned on and the first bit line voltage $V_{BL1}$ is equal to 0V during the program cycle, the non-volatile memory cell 40 is programmed to be in the first storage state. In case that the program path of the non-volatile memory cell 40 is turned on and the first bit line voltage $V_{BL1}$ is equal to 7.5V during the program cycle, the non-volatile memory cell 40 is programmed to be in the second storage state.

Please refer to FIG. 3A. During the read cycle, the source line voltage $V_{SL}$ is equal to Vpp, the first select gate voltage $V_{SG1}$ is 0V, the second select gate voltage $V_{SG2}$ is 0V, the N-well voltage $V_{NW}$ is equal to Vdd, the first bit line voltage $V_{BL1}$ is 0V, and the second bit line voltage $V_{BL2}$ is 0V. The voltage Vdd is a second voltage. The second voltage Vdd is lower than the first voltage Vpp. The second voltage Vdd is within the range between 0.7V and 2.0V. For example, the second voltage Vdd is 0.8V.

Figure 3D:
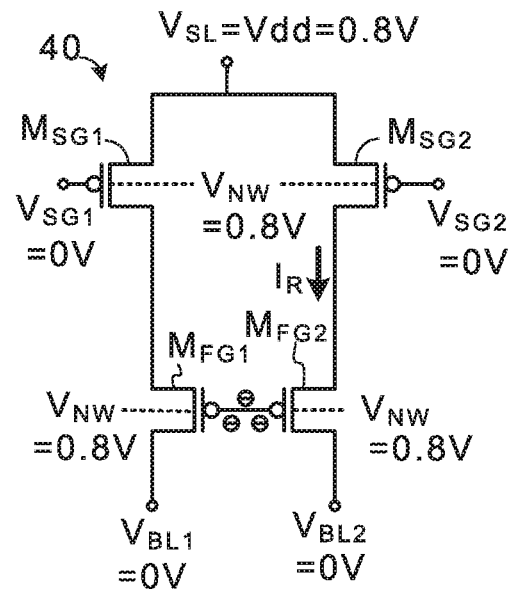

Please refer to FIG. 3D. During the read cycle, the second select transistor $M_{SG2}$ is turned on. That is, the read path is turned on. Since the non-volatile memory cell 40 is in the first storage state, the hot carriers (e.g., electrons) are stored in the shared floating gate of the first floating gate transistor $M_{FG1}$ and the second floating gate transistor $M_{FG2}$. Consequently, the magnitude of the read current $I_R$ generated by the second floating gate transistor $M_{FG2}$ is higher.

As mentioned above, the first select transistor $M_{SG1}$ is a MV device. Consequently, during the read cycle, the voltage between the source line voltage $V_{SL}$ and the first select gate voltage $V_{SG1}$ of the first select transistor $M_{SG1}$ in the program path is 0.8V. Since the first select transistor $M_{SG1}$ cannot be completely turned on, the program path is turned off.

Figure 3E:
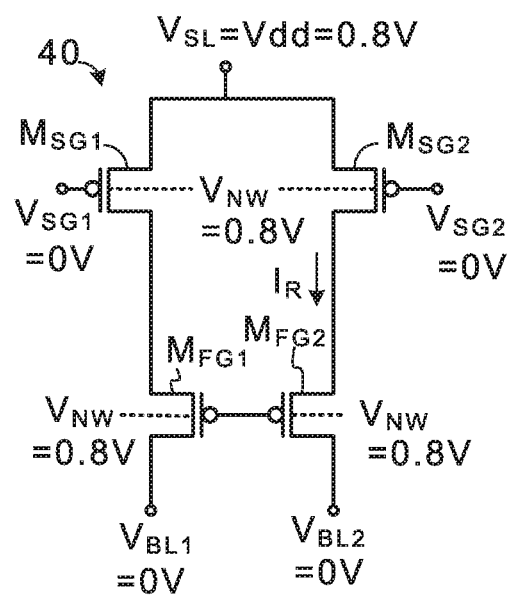

Please refer to FIG. 3E. During the read cycle, the second select transistor $M_{SG2}$ is turned on. That is, the read path is turned on. Since the non-volatile memory cell 40 is in the second storage state, the hot carriers (e.g., electrons) are stored in the shared floating gate of the first floating gate transistor $M_{FG1}$ and the second floating gate transistor $M_{FG2}$. Consequently, the magnitude of the read current $I_R$ generated by the second floating gate transistor $M_{FG2}$ is very low (e.g., nearly zero).

Similarly, since the first select transistor $M_{SG1}$ cannot be completely turned on during the read cycle, the program path is turned off.

During the read cycle, the read path of the non-volatile memory cell 40 is turned on. Consequently, the non-volatile memory cell 40 generates the read current $I_R$. According to the magnitude of the read current $I_R$, the storage state of the non-volatile memory cell 40 is determined. For example, a reference current is provided. If the read current $I_R$ is higher than the reference current, the non-volatile memory cell 40 is in the first storage state. Whereas, if the read current $I_R$ is lower than the reference current, the non-volatile memory cell 40 is in the second storage state.

Figure 4:
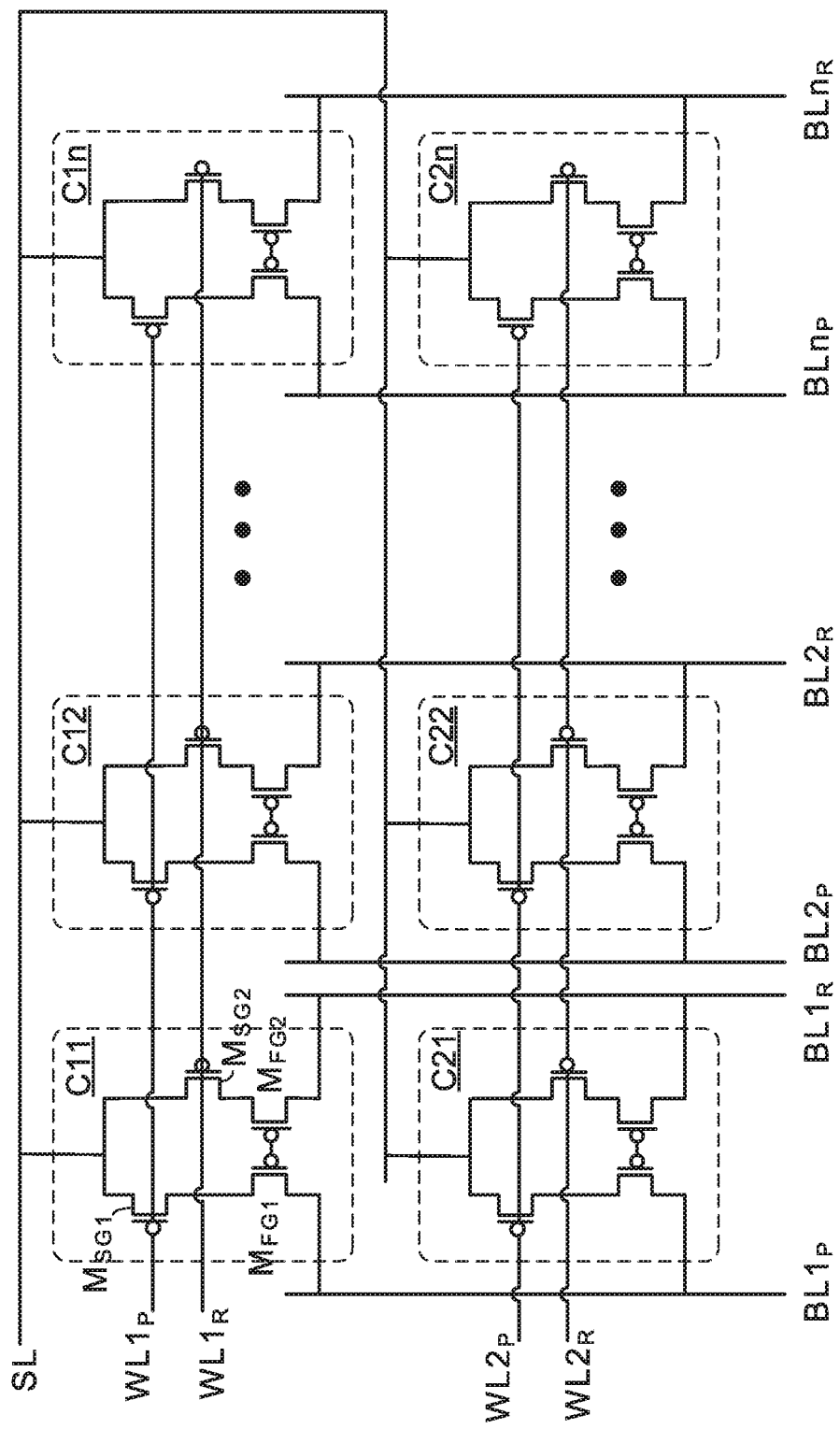
FIG. 4 is a schematic circuit diagram illustrating a non-volatile memory cell array composed of plural non-volatile memory cells according to an embodiment of the present invention.

FIG. 4 is a schematic circuit diagram illustrating a non-volatile memory cell array composed of plural non-volatile memory cells according to an embodiment of the present invention. As shown in FIG. 4, the non-volatile memory cell array comprises non-volatile memory cells C11~C2n in a 2×n array. Each of the non-volatile memory cells C11~C2n has the same structure as the non-volatile memory cell shown in FIG. 2D.

Take the non-volatile memory cell C11 for example. The non-volatile memory cell C11 has five terminals. The source line SL is connected with the first terminal. The first terminal is connected with the first source/drain terminal of the first select transistor $M_{SG1}$ and the first source/drain terminal of the second select transistor $M_{SG2}$. A first program word line $WL1_P$ is connected with the second terminal. The second terminal is connected with the first select gate of the first select transistor $M_{SG1}$. A first read word line $WL1_R$ is connected with the third terminal. The third terminal is connected with the second select gate of the second select transistor $M_{SG2}$. A first program bit line $BL1_P$ is connected with the fourth terminal. The fourth terminal is connected with the second source/drain terminal of the first select transistor $M_{SG1}$. A first read bit line $BL1_R$ is connected with the fifth terminal. The fifth terminal is connected with the second source/drain terminal of the second select transistor $M_{SG2}$.

The n non-volatile memory cells C11~C1n in the first row are connected with the source line SL, the first program word line $WL1_P$ and the first read word line $WL1_R$. Moreover, the n non-volatile memory cells C11~C1n in the first row are connected with the corresponding program bit lines $BL1_P$~$BLn_P$ and the corresponding read word lines $BL1_R$~$BLn_R$.

The n non-volatile memory cells C21~C2n in the second row are connected with the source line SL, a second program word line $WL2_P$ and a second read word line $WL2_R$. Moreover, the n non-volatile memory cells C21~C2n in the second row are connected with the corresponding program bit lines $BL1_P$~$BLn_P$ and the corresponding read word lines $BL1_R$~$BLn_R$.

Figure 5A:
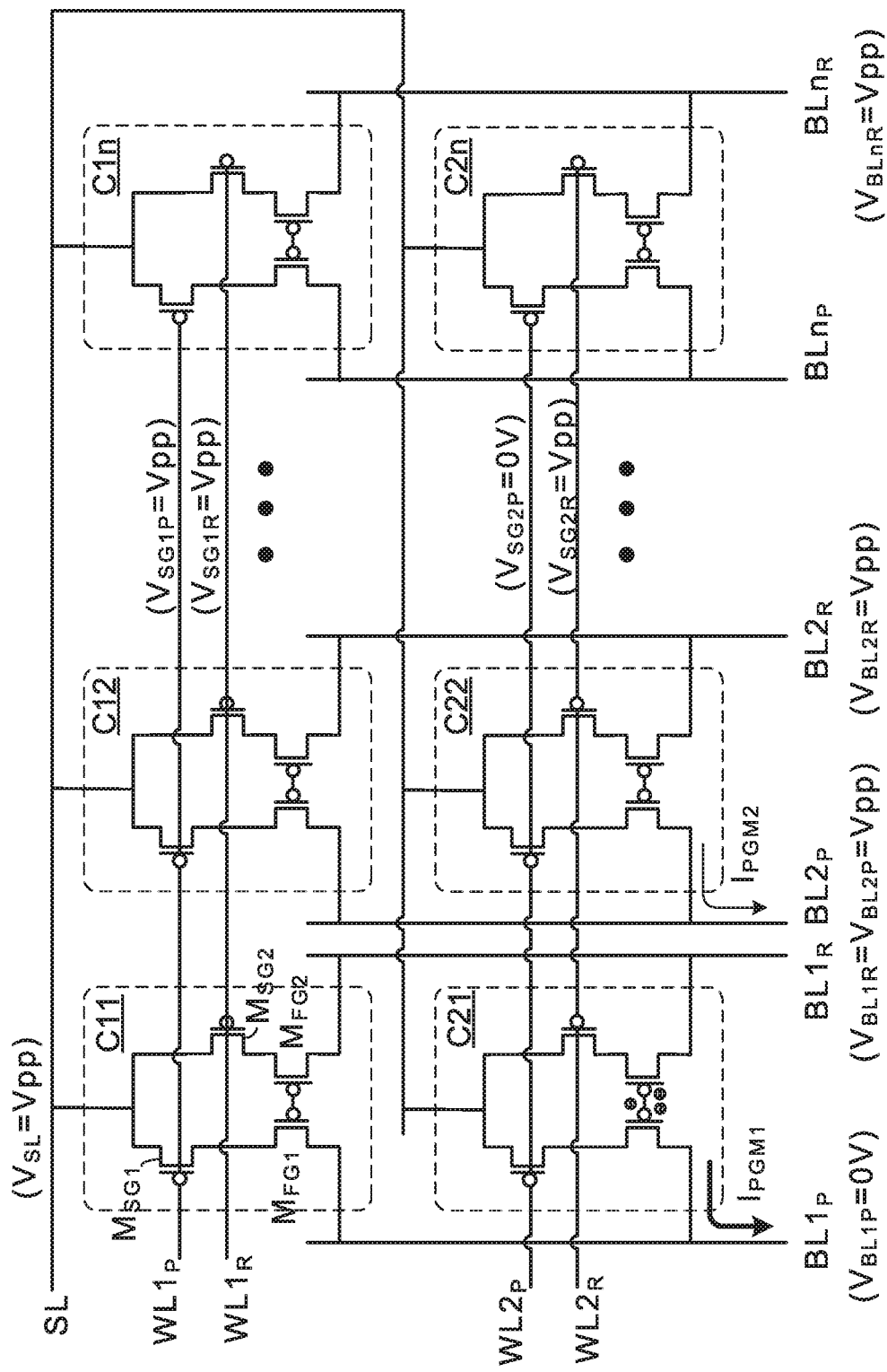
FIGS. 5A and 5B schematically illustrate associated voltage signals for programming and reading the non-volatile memory cell array according to the embodiment of the present invention.
Figure 5B:
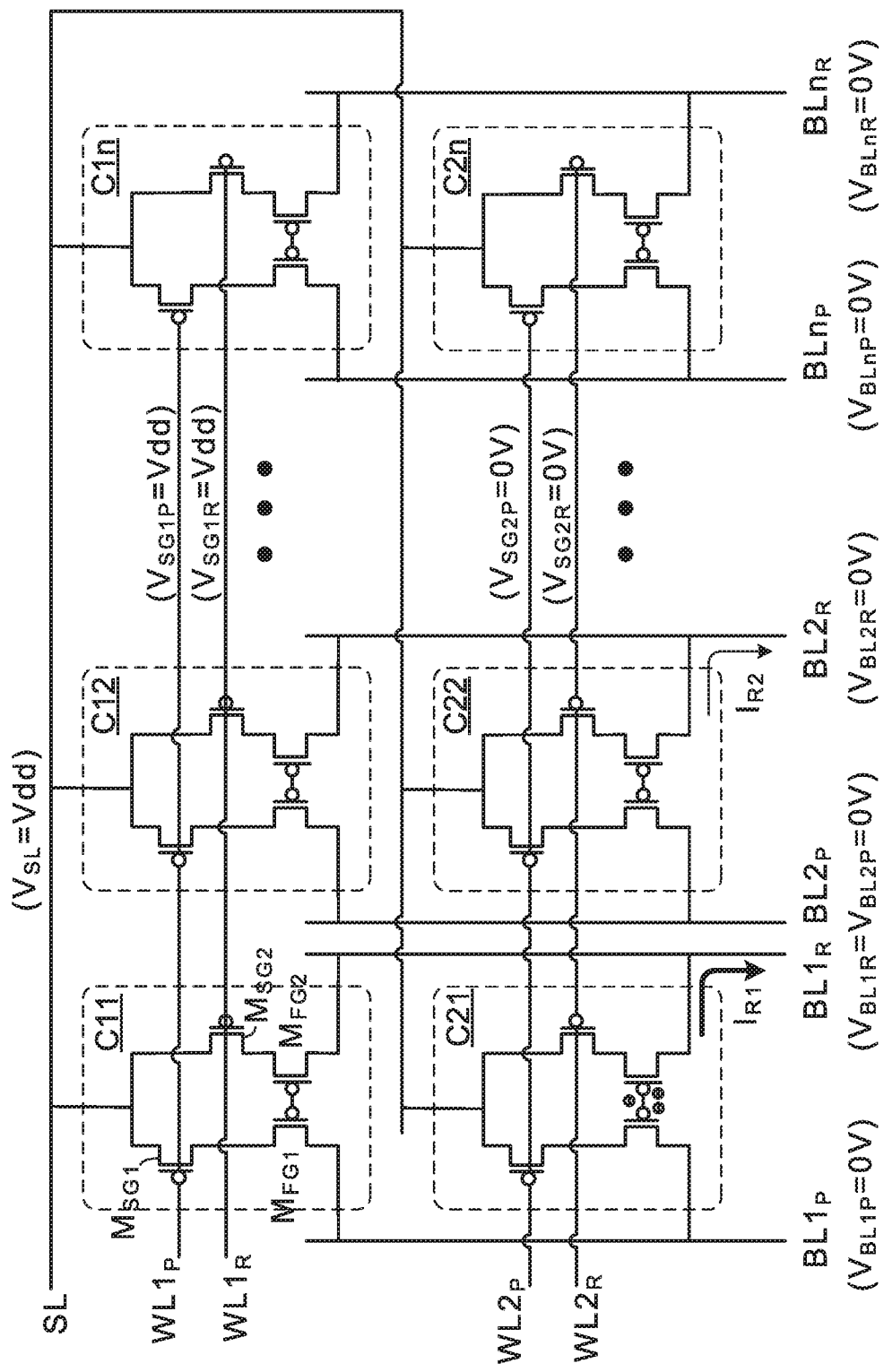

FIGS. 5A and 5B schematically illustrate associated voltage signals for programming and reading the non-volatile memory cell array according to the embodiment of the present invention. In the following example, the non-volatile memory cell C21 is programmed to the first storage state, and the non-volatile memory cell C22 is programmed to the second storage state. During the read cycle, the read currents of the non-volatile memory cell C21 and the non-volatile memory cell C22 are read.

Please refer to FIG. 5A. During the program cycle, the source line voltage $V_{SL}$ applied to the source line SL is equal to Vpp, the select gate voltage $V_{SG1P}$ applied to the first program word line $WL1_P$ is equal to Vpp, and the select gate voltage $V_{SG1R}$ applied to the first read word line $WL1_R$ is equal to Vpp. In the non-volatile memory cell array, the first row is an unselected row. Moreover, the program path and the read path of the n non-volatile memory cells C11~C1n in the first row are turned off. The voltage Vpp is a first voltage. The first voltage Vpp is within the range between 5.0V and 10V.

Moreover, the select gate voltage $V_{SG2P}$ applied to the second program word line $WL2_P$ is 0V, and the select gate voltage $V_{SG2R}$ applied to the second read word line $WL2_R$ is equal to Vpp. The bit line voltages $V_{BL1R}$~$V_{BLnR}$ applied to the read word lines $BL1_R$~$BLn_R$ are all equal to Vpp. Consequently, the second row of the non-volatile memory cell array is the selected row, and the read paths of the non-volatile memory cells C21~C2n in the second row are all turned off.

Moreover, according to the bit line voltages $V_{BL1P}$~$V_{BLnP}$ applied to the program bit lines $BL1_P$~$BLn_P$, the non-volatile memory cells C21~C2n in the selected row are programmed to be in the first storage state or the second storage state.

As shown in FIG. 5A, the bit line voltage $V_{BL1P}$ applied to the first program bit lines $BL1_P$ is 0V. The program current $I_{PGM1}$ generated by the non-volatile memory cell C21 is higher. Consequently, hot carriers (e.g., electrons) are injected into the floating gate of the first floating gate transistor $M_{FG1}$. Under this circumstance, the non-volatile memory cell C21 is programmed to be in the first storage state. The bit line voltage $V_{BL2P}$ applied to the second program bit lines $BL2_P$ is equal to Vpp. The program current $I_{PGM2}$ generated by the non-volatile memory cell C22 is very low (i.e., nearly zero). Under this circumstance, the non-volatile memory cell C22 is programmed to be in the second storage state. By the above method, the other memory cells in the selected row can be programmed to be in the specified storage states.

Please refer to FIG. 5B. During the read cycle, the source line voltage $V_{SL}$ applied to the source line SL is equal to Vpp, the select gate voltage $V_{SG1P}$ applied to the first program word line $WL1_P$ is equal to Vpp, and the select gate voltage $V_{SG1R}$ applied to the first read word line $WL1_R$ is equal to Vdd. In the non-volatile memory cell array, the first row is an unselected row. Moreover, the program path and the read path of the n non-volatile memory cells C11~C1n in the first row are turned off. The voltage Vdd is a second voltage. The second voltage Vdd is within the range between 0.7V and 2.0V.

Moreover, the select gate voltage $V_{SG2P}$ applied to the second program word line $WL2_P$ is 0V, and the select gate voltage $V_{SG2R}$ applied to the second read word line $WL2_R$ is 0V. The bit line voltages $V_{BL1R}$~$V_{BLnR}$ applied to the read word lines $BL1_R$~$BLn_R$ are all 0V. The bit line voltages $V_{BL1P}$~$V_{BLnP}$ applied to the read word lines $BL1_P$~$BLn_P$ are all 0V. Consequently, the second row of the non-volatile memory cell array is the selected row.

Since the first select transistors of the n non-volatile memory cells C21~C2n in the selected row are MV devices, the program paths of the n non-volatile memory cells C21~C2n are turned off. Since the second select transistors of the n non-volatile memory cells C21·C2n in the second row are LV devices, the program paths of the n non-volatile memory cells C21~C2n are turned on.

Please refer to FIG. 5B again. In case that the non-volatile memory cell C21 is in the first storage state, the non-volatile memory cell C21 generates a higher read current $I_{R1}$ to the first read bit line $BL1_R$. In case that the non-volatile memory cell C22 is in the second storage state, the non-volatile memory cell C22 generates a lower read current $I_{R2}$ to the second read bit line $BL2_R$. According to the read current $I_{R1}$ flowing through the first read bit line $BL1_R$, the non-volatile memory cell C21 is determined to be in the first storage state. According to the read current $I_{R2}$ flowing through the second read bit line $BL2_R$, the non-volatile memory cell C22 is determined to be in the second storage state. By the above method, the storage states of the other memory cells in the selected row can be determined.

From the above descriptions, the present invention provides a non-volatile memory cell and a non-volatile memory array. Each non-volatile memory cell includes a program path and a read path. The program path includes a first select transistor and a first floating gate transistor, which are connected with each other. The read path includes a second select transistor and a second floating gate transistor, which are connected with each other. Since the second select transistor is a LV device, the read operation of the non-volatile memory cell is performed according to the low voltage.

For protecting the first floating gate transistor and the second floating gate transistor, a silicide blocking layer is formed over the floating gate completely. Since the floating gate is protected by the silicide blocking layer, the data retention time of the non-volatile memory array can be extended.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A non-volatile memory cell array comprising a first non-volatile memory cell, the first non-volatile memory cell comprising:
   a first select transistor, wherein a first source/drain terminal of the first select transistor is connected with a source line, and a first select gate of the first select transistor is connected with a first program word line;
   a first floating gate transistor with a first floating gate, wherein a first source/drain terminal of the first floating gate transistor is connected with a second source/drain terminal of the first select transistor, and a second source/drain terminal of the first floating gate transistor is connected with a first program bit line;
   a second select transistor, wherein a first source/drain terminal of the second select transistor is connected with the source line, and a second select gate of the second select transistor is connected with a first read word line; and
   a second floating gate transistor with a second floating gate, wherein a first source/drain terminal of the second floating gate transistor is connected with a second source/drain terminal of the second select transistor, and a second source/drain terminal of the second floating gate transistor is connected with a first read bit line, wherein the first floating gate and the second floating gate are connected with each other.

2. The non-volatile memory cell array as claimed in claim 1, wherein a gate oxide layer of the second select transistor is thinner than a gate oxide layer of the first select transistor.

3. The non-volatile memory cell array as claimed in claim 1, wherein the first select transistor, the first floating gate transistor and the second floating gate transistor are fabricated by a medium voltage device manufacturing process, and the second select transistor is fabricated by a low voltage device manufacturing process.

4. The non-volatile memory cell array as claimed in claim 1, wherein the first select transistor, the first floating gate transistor, the second select transistor and the second floating gate transistor are p-type transistors.

5. The non-volatile memory cell array as claimed in claim 1, wherein during a program cycle, the source line receives a first voltage, the first program word line receives a ground voltage, the first read word line receives the first voltage, and the first read bit line receives the first voltage, wherein if the first program word line receives the ground voltage, the non-volatile memory cell is programmed to be in a first storage state, wherein if the first program word line receives the first voltage, the non-volatile memory cell is programmed to be in a second storage state.

6. The non-volatile memory cell array as claimed in claim 5, wherein the first voltage is within a range between 5.0V and 10V.

7. The non-volatile memory cell array as claimed in claim 5, wherein during a read cycle, the source line receives a second voltage, the first program word line receives the ground voltage, the first program bit line receives the ground voltage, the first read word line receives the ground voltage, the first read bit line receives the ground voltage, and the non-volatile memory cell generates a read current, wherein if the read current is higher than a reference current, the non-volatile memory cell is in the first storage state, wherein if the read current is lower than the reference current, the non-volatile memory cell is in the second storage state.

8. The non-volatile memory cell array as claimed in claim 7, wherein the second voltage is within a range between 0.7V and 2.0V.

9. The non-volatile memory cell array as claimed in claim 1, further comprising a second non-volatile memory cell, wherein a first terminal of the second non-volatile memory cell is connected with the source line, a second terminal of the second non-volatile memory cell is connected with the first program word line, a third terminal of the second non-volatile memory cell is connected with the first read word line, a fourth terminal of the second non-volatile memory cell is connected with a second program bit line, and a fifth terminal of the second non-volatile memory cell is connected with a second read bit line.

10. The non-volatile memory cell array as claimed in claim 9, further comprising a third non-volatile memory cell, wherein a first terminal of the third non-volatile memory cell is connected with the source line, a second terminal of the third non-volatile memory cell is connected with a second program word line, a third terminal of the third non-volatile memory cell is connected with a second read word line, a fourth terminal of the third non-volatile memory cell is connected with the first program bit line, and a fifth terminal of the third non-volatile memory cell is connected with the first read bit line.

11. The non-volatile memory cell array as claimed in claim 10, further comprising a fourth non-volatile memory cell, wherein a first terminal of the fourth non-volatile memory cell is connected with the source line, a second terminal of the fourth non-volatile memory cell is connected with the second program word line, a third terminal of the fourth non-volatile memory cell is connected with the second read word line, a fourth terminal of the fourth non-volatile memory cell is connected with the second program bit line, and a fifth terminal of the fourth non-volatile memory cell is connected with the second read bit line.

12. A non-volatile memory cell, comprising:
a p-type substrate, wherein an N-well region is disposed under a first surface of the p-type substrate;
a first gate oxide layer;
a second gate oxide layer;
a third gate oxide layer;
a first p-type source/drain region connected with a source line;
a second p-type source/drain region, wherein the first p-type source/drain region and the second p-type source/drain region are disposed under the first surface of the p-type substrate, and respectively located at two opposed sides of the first gate oxide layer;
a third p-type source/drain region connected with a first bit line, wherein the second p-type source/drain region and the third p-type source/drain region are disposed under the first surface of the p-type substrate, and respectively located at two opposed sides of the second gate oxide layer;
a fourth p-type source/drain region connected with the source line;
a fifth p-type source/drain region, wherein the fourth p-type source/drain region and the fifth p-type source/drain region are disposed under the first surface of the p-type substrate, and respectively located at two opposed sides of the third gate oxide layer;
a sixth p-type source/drain region connected with a second bit line, wherein the fifth p-type source/drain region and the sixth p-type source/drain region are disposed under the first surface of the p-type substrate, and respectively located at two opposed sides of the second gate oxide layer, wherein the first p-type source/drain region, the second p-type source/drain region, the third p-type source/drain region, the fourth p-type source/drain region, the fifth p-type source/drain region and the sixth p-type source/drain region are not in contact with each other;
a first select gate disposed over the first gate oxide layer, and connected with a first word line;
a second select gate disposed over the third gate oxide layer, and connected with a second word line; and
a floating gate disposed over the second gate oxide layer, wherein the first gate oxide layer is thicker than the third gate oxide layer, and the second gate oxide layer is thicker than the third gate oxide layer.

13. The non-volatile memory cell as claimed in claim 12, wherein the N-well region comprises:
a medium voltage N-well region disposed under the first gate oxide layer and the second gate oxide layer; and
a low voltage N-well region disposed under the third gate oxide layer, wherein the medium voltage N-well region and the low voltage N-well region are in contact with each other,
wherein the medium voltage N-well region is formed by a medium voltage device manufacturing process, and the low voltage N-well region is formed by a low voltage device manufacturing process.

14. The non-volatile memory cell as claimed in claim 12, wherein the fifth p-type source/drain region comprises:
a first sub-region disposed under the first surface of the p-type substrate, and located beside the second gate oxide layer; and
a second sub-region disposed under the first surface of the p-type substrate, and located beside the third gate oxide layer, wherein the first sub-region and the second sub-region are in contact with each other,
wherein the first sub-region is formed by a medium voltage device manufacturing process, and the second sub-region is formed by a low voltage device manufacturing process.

15. The non-volatile memory cell as claimed in claim 12, further comprising a silicide blocking layer, which is formed over the floating gate.

* * * * *